(12) United States Patent
Ueda et al.

(10) Patent No.: US 7,735,375 B2
(45) Date of Patent: Jun. 15, 2010

(54) STRESS-DISTRIBUTION DETECTING SEMICONDUCTOR PACKAGE GROUP AND DETECTION METHOD OF STRESS DISTRIBUTION IN SEMICONDUCTOR PACKAGE USING THE SAME

(75) Inventors: Naohiro Ueda, Hyogo (JP); Hirofumi Watanabe, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 72 days.

(21) Appl. No.: 12/201,350

(22) Filed: Aug. 29, 2008

(65) Prior Publication Data
US 2009/0064791 A1    Mar. 12, 2009

(30) Foreign Application Priority Data
Sep. 7, 2007    (JP) .............................. 2007-233092

(51) Int. Cl.
*G01B 7/16* (2006.01)
(52) U.S. Cl. .......................................... 73/777; 73/760
(58) Field of Classification Search ........... 73/760–777; 438/15
See application file for complete search history.

(56) References Cited
U.S. PATENT DOCUMENTS 6,222,145 B1 * 4/2001 Cook et al. ................. 209/573
6,332,359 B1 * 12/2001 Ueyanagi et al. .......... 73/514.33
2007/0240519 A1 * 10/2007 Shimazu et al. ............... 73/777
2009/0058443 A1 * 3/2009 Ohashi et al. ................ 324/754

FOREIGN PATENT DOCUMENTS

JP          7-235578        9/1995
JP          2005-209827     8/2005

* cited by examiner

*Primary Examiner*—Max Noori
(74) *Attorney, Agent, or Firm*—Cooper & Dunham LLP

(57) ABSTRACT

A disclosed stress-distribution detecting semiconductor package group includes multiple stress-distribution detecting semiconductor packages each formed by resin-encapsulating a stress detecting semiconductor chip of the same size using an identical resin encapsulation structure. Each stress detecting semiconductor chip includes a piezoelectric element for stress detection and at least two electrode pads electrically connected to the piezoelectric element to measure an electrical property of the piezoelectric element. The piezoelectric elements of the stress detecting semiconductor chips are respectively disposed on the corresponding stress detecting semiconductor chips to be located at different positions from one another when superimposed on a single imaginary semiconductor chip plane having the same plane size as that of the stress detecting semiconductor chips.

4 Claims, 12 Drawing Sheets

STRESS-DISTRIBUTION DETECTING SEMICONDUCTOR PACKAGE GROUP AND DETECTION METHOD OF STRESS DISTRIBUTION IN SEMICONDUCTOR PACKAGE USING THE SAME

BACKGROUND OF THE INVENTION

1. Field of the Invention

The present invention relates to a stress-distribution detecting semiconductor package group used to detect stress distribution in a resin-encapsulated semiconductor package, and also relates to a detection method of stress distribution in a semiconductor package (hereinafter, referred to as "semiconductor-package stress-distribution detection method") using the stress-distribution detecting semiconductor package group.

2. Description of the Related Art

With the recent rapid growth in popularity of portable electronic devices, there is a demand for reducing the size of electronics used in such portable electronic devices, and ICs (Integrated Circuits) are no exception. The demand has increased not only for size reduction but also for high accuracy, and increasing the initial accuracy of analog ICs and minimizing the property variations, for example, are major technical challenges for device development.

One factor that impedes producing ICs having highly accurate electrical properties is property change in a semiconductor device associated with a molded package process. A property change occurs as a molding resin having a high linear expansion coefficient hardens and contracts in a resin encapsulation process, which causes compressive stress over the surface of the semiconductor chip. For various devices, the piezoelectric effect due to this compressive stress causes change in their electrical properties, which then results in changing their circuit characteristics having been obtained at wafer level. SPICE parameters extracted from wafer-level measurements are generally used in circuit designing, and therefore the property change caused by the molded packaging is not taken into account in the design.

In trying to address such a problem, there is a disclosed method of employing a stress-distribution detecting semiconductor chip, on which multiple piezoelectric resistive elements are formed, and detecting distribution of stress applied to the stress-distribution detecting semiconductor chip due to resin encapsulation molding (for example, see Patent Document 1). Since the resistance of a piezoelectric resistive element changes with stress, the distribution of stress applied to the stress-distribution detecting semiconductor chip can be detected by measuring change in the resistance of each piezoelectric resistive element from before to after resin encapsulation.

Patent Document 1: Japanese Laid-open Patent Application Publication No. 2005-209827

In a stress-distribution detecting semiconductor chip, both terminals of each piezoelectric resistive element are respectively connected to different electrode pads to measure the resistance of the piezoelectric resistive element. In order to accurately reflect the stress distribution detected using the stress-distribution detecting semiconductor chip in the designing process of a finished product of a semiconductor chip, not only the packaging structure but also the chip size and the number of electrode pads need to be made the same between the stress-distribution detecting semiconductor chip and the finished semiconductor chip.

However, if an equal number of electrode pads are provided for the finished semiconductor chip and for the stress-distribution detecting semiconductor chip, the number of piezoelectric resistive elements on the stress-distribution detecting semiconductor chip is limited by the number of electrode pads of the finished semiconductor chip, and accordingly a conventional stress-distribution detecting semiconductor chip is not able to thoroughly detect the stress distribution over the entire extent of the semiconductor chip. For example, in the case of a small IC of less than 1 mm in size, about four to eight electrode pads are provided; however, only two to four stress-detection piezoelectric resistive elements can be disposed on a stress-distribution detecting semiconductor chip for such a small IC. That is to say, change in the resistance of the piezoelectric resistive elements can be measured at only two to four positions on the stress-distribution detecting semiconductor chip, thus leaving a problem of not being able to thoroughly detect the stress distribution over the entire extent of the semiconductor chip.

SUMMARY OF THE INVENTION

In view of the above-mentioned problem, the present invention aims at providing a stress-distribution detecting semiconductor package group and a semiconductor-package stress-distribution detection method using the stress-distribution detecting semiconductor package group, both of which are capable of detecting the stress distribution over the entire extent of the stress detecting semiconductor chip regardless of the number of electrode pads of the finished semiconductor chip.

The stress-distribution detecting semiconductor package group according to one embodiment of the present invention includes multiple stress-distribution detecting semiconductor packages each formed by resin-encapsulating a stress detecting semiconductor chip of the same size using an identical resin encapsulation structure. Each stress detecting semiconductor chip includes a piezoelectric element for stress detection and at least two electrode pads electrically connected to the piezoelectric element to measure an electrical property of the piezoelectric element. The piezoelectric elements of the stress detecting semiconductor chips are respectively disposed on the corresponding stress detecting semiconductor chips to be located at different positions from one another when superimposed on a single imaginary semiconductor chip plane having the same plane size as that of the stress detecting semiconductor chips.

The term "identical resin encapsulation structure" herein referred to means that structures of the following members are identical: wiring members such as a lead frame and a wiring substrate; connecting terminals—such as bonding wires and solder bumps—for connecting the electrode pads and wiring members; and an encapsulation resin.

The stress-distribution detecting semiconductor package group according to one embodiment of the present invention may be arranged such that the piezoelectric elements are piezoelectric resistive elements formed of diffusion resistances, and each stress detecting semiconductor chip includes at least four electrode pads electrically connected to the piezoelectric element to measure the resistance of the piezoelectric element by a four-terminal method.

The term "four-terminal method" herein referred to is a method for measuring the resistance of a resistive element by providing separate circuits for supplying current to the resistive element and for measuring the voltage at two points on the resistance element.

DETAILED DESCRIPTION OF THE PREFERRED EMBODIMENTS

Figure 1:
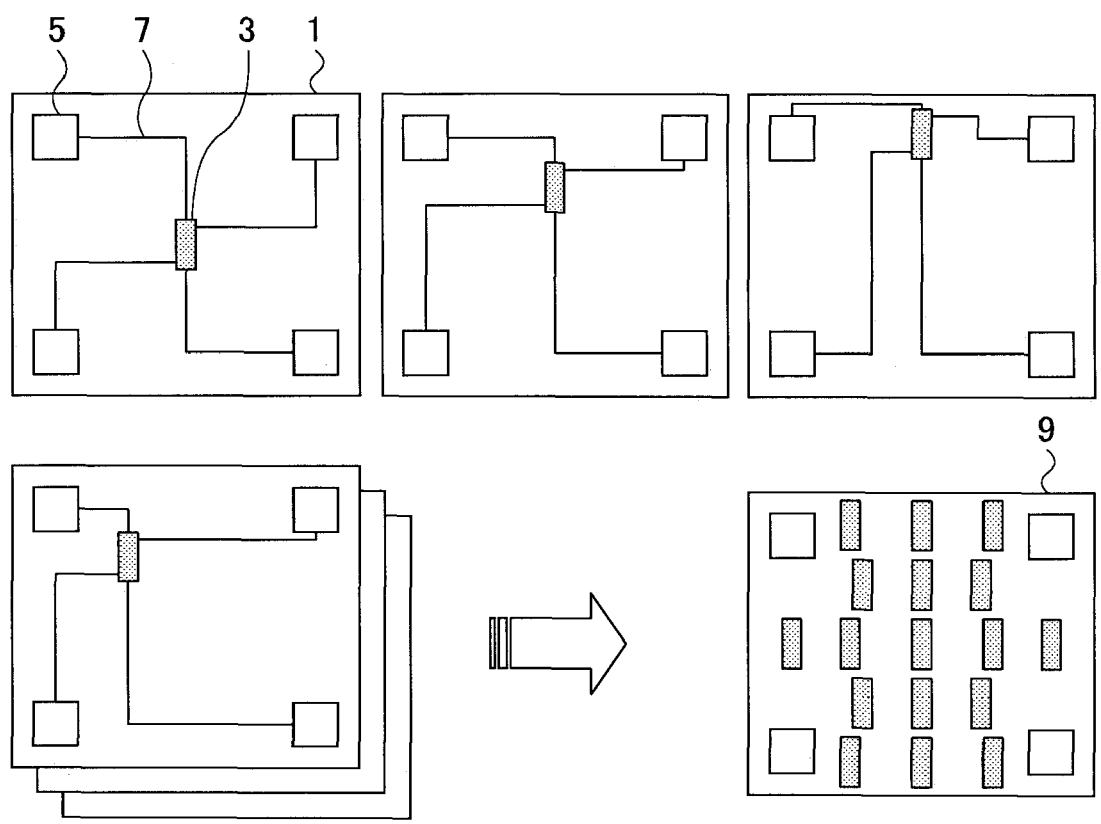
FIG. 1 illustrates one embodiment of a stress-distribution detecting semiconductor package group of the present invention, and shows a schematic plan view of an arrangement of electrode pads and a piezoelectric resistive element on a stress detecting semiconductor chip of each stress-distribution detecting semiconductor package.

FIG. 1 illustrates one embodiment of a stress-distribution detecting semiconductor package group of the present invention, and shows a schematic plan view of an arrangement of electrode pads and a piezoelectric resistive element on a stress detecting semiconductor chip of each stress-distribution detecting semiconductor package. In this embodiment, piezoelectric resistive elements formed of diffusion resistances are used as piezoelectric elements for stress detection.

The stress-distribution detecting semiconductor package group of the present embodiment comprises, for instance, seventeen stress-distribution detecting semiconductor packages. In each stress-distribution detecting semiconductor package, a stress detecting semiconductor chip 1 includes one piezoelectric resistive element 3 and four electrode pads 5. The plane size of each stress detecting semiconductor chip 1 is 0.8 mm by 0.7 mm, for example. The plane size of the piezoelectric resistive element 3 is 2 μm by 30 μm, for example. The piezoelectric resistive element 3 is formed of a diffusion resistance having a conductivity type opposite to that of a semiconductor substrate, on which the diffusion resistance is formed.

Two electrode pads 5 are connected to one terminal of the piezoelectric resistive element 3 via a wiring pattern 7. The remaining two electrode pads 5 are connected to the other terminal of the piezoelectric resistive element 3 via the wiring pattern 7. Connecting in this manner enables measurement of the resistance of the piezoelectric resistive element 3 by a four-terminal method.

Seventeen stress detecting semiconductor chips 1 respectively have their piezoelectric resistive elements 3 at different positions from each other. The position of each piezoelectric resistive element 3 of the seventeen stress detecting semiconductor chips 1 is shown by superimposing the piezoelectric resistive elements 3 on an imaginary semiconductor chip 9 having the same plane size as that of the stress detecting semiconductor chip 1. As shown in the imaginary semiconductor chip 9, the piezoelectric resistive elements 3 are arranged so as to be evenly distributed across the plane of the imaginary semiconductor chip 9.

Figure 2:
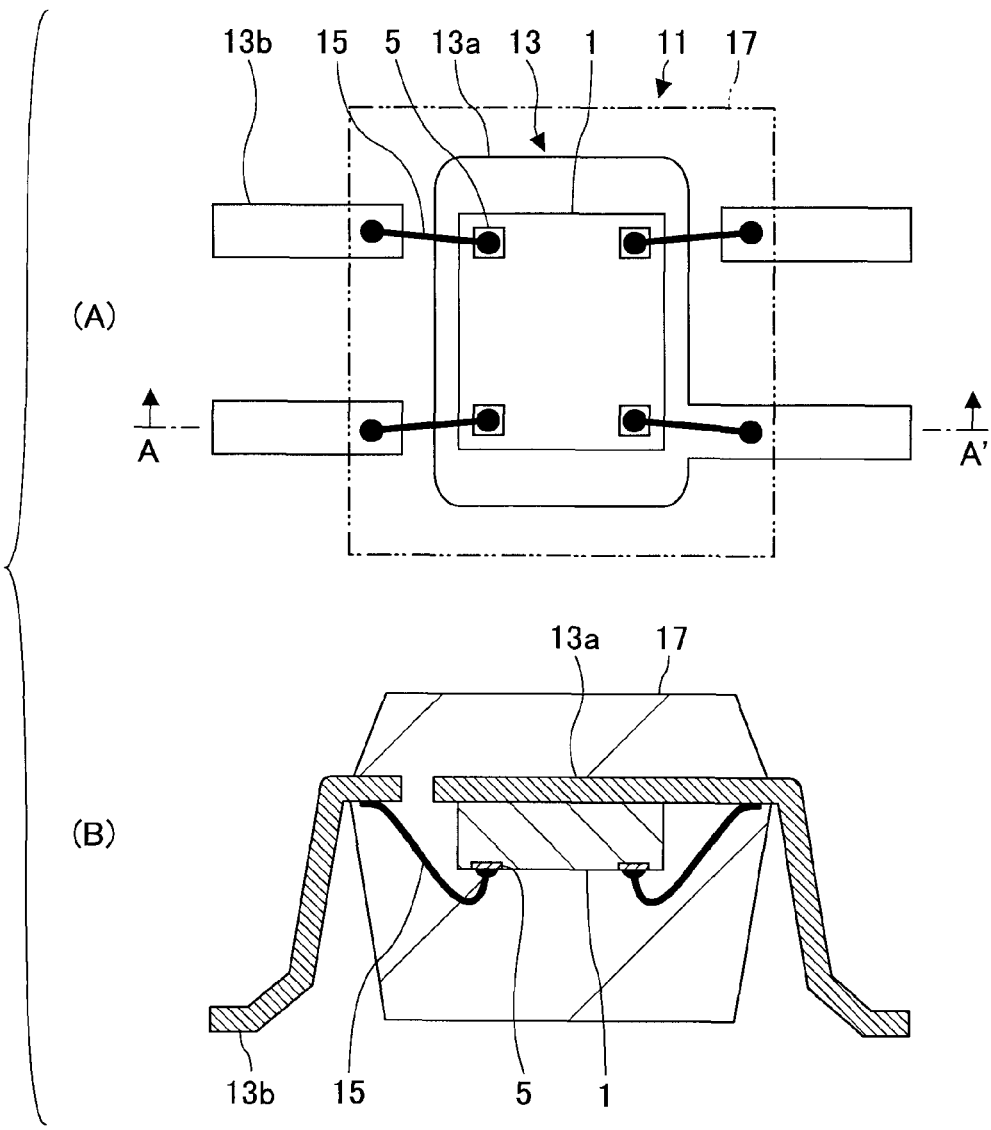
FIG. 2 shows one example of the stress-distribution detecting semiconductor package, with (A) providing a plan view and (B) providing a cross-sectional view along the line A-A'.

FIG. 2 shows one example of the stress-distribution detecting semiconductor package, with (A) providing a plan view and (B) providing a cross-sectional view along the line A-A'.

In a stress-distribution detecting semiconductor package 11, the stress detecting semiconductor chip 1 is mounted on a tab 13a of a lead frame 13. Four outer leads 13b are also provided on the lead frame 13, and are electrically insulated from each other. One of the outer leads 13b is connected to the tab 13a.

Each of the four electrode pads 5 of the stress detecting semiconductor chip 1 is connected to a different one of the outer leads 13b via a bonding wire 15. The stress detecting semiconductor chip 1, the tab 13a, the base ends (on the tab 13a side) of the outer leads 13b and the bonding wires 15 are encapsulated with a molded resin (encapsulating resin) 17. The top ends of the outer leads 13b are not encapsulated with the molded resin 17.

All seventeen stress detecting semiconductor chips 1 are resin-encapsulated using an identical resin encapsulation structure to form seventeen stress-distribution detecting semiconductor packages 11. The following describes a flow of detecting distribution of stress applied to the stress detecting semiconductor chips 1 using the seventeen stress-distribution detecting semiconductor packages 11.

For the seventeen stress detecting semiconductor chips 1, resistance of each piezoelectric resistive element 3 is measured before the resin encapsulation by the four-terminal method. Here, the resistance of the piezoelectric resistive element 3 is measured with the stress detecting semiconductor chip 1 bonded on a wafer. Note however that the resistance measurement of the piezoelectric resistive element 3 before the resin encapsulation may be carried out after the stress detecting semiconductor chip 1 is separated from the wafer.

Then, each stress detecting semiconductor chip 1 is separated from the wafer, and resin-encapsulated using an identical resin encapsulation structure so as to form a stress-distribution detecting semiconductor package 11. Subsequently, for each stress-distribution detecting semiconductor package 11, the resistance of the piezoelectric resistive element 3 is measured. Herewith, resistance measurements of the piezoelectric resistive element 3 before and after the resin encapsulation are obtained for the seventeen positions on the imaginary semiconductor chip 9 of FIG. 1.

Changes in the resistances of the piezoelectric resistive element 3 from before to after the resin encapsulation are superimposed one upon the other on the plane of the imaginary semiconductor chip 9 having the same plane size as that of the stress detecting semiconductor chip 1, whereby distribution of stress applied to the stress detecting semiconductor chips 1 due to resin encapsulation is detected. Here, a change in the resistance of each piezoelectric resistive element 3 is obtained in the rate of change (%). Note however that an index indicating the change in the resistance of the piezoelectric resistive element 3 is not limited to the rate of change, and another index may be used instead—for example, a difference in the resistance of the piezoelectric resistive element 3 before and after the resin encapsulation.

Figure 3:
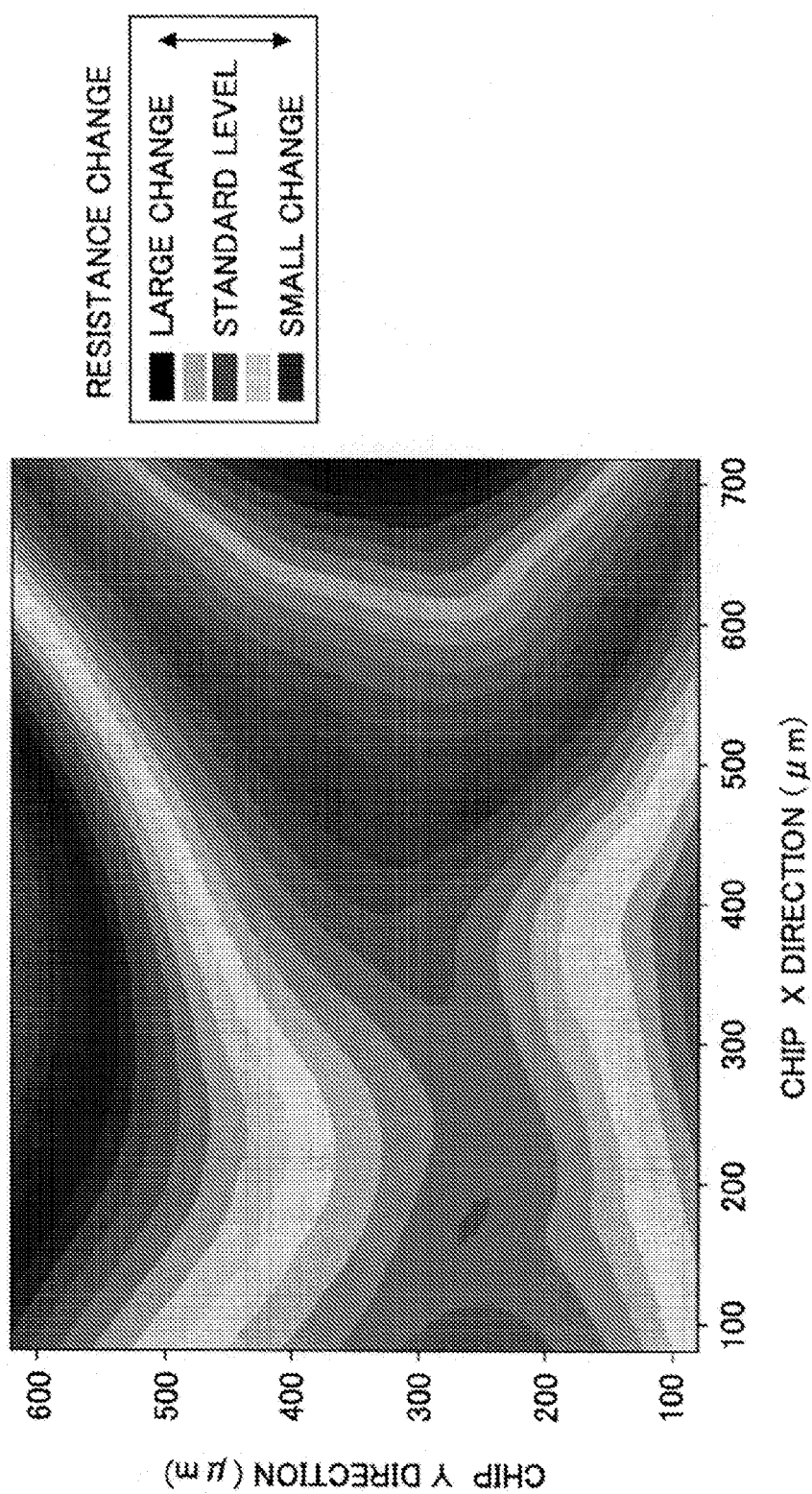
FIG. 3 is a contour plot of rate of change of resistance of piezoelectric resistive elements in arbitrary units, and shows detection results of distribution of stress applied to stress detecting semiconductor chips 1.

FIG. 3 is a contour plot of the rate of change of the resistance of piezoelectric resistive elements 3 in arbitrary units, and shows detection results of the distribution of stress applied to the stress detecting semiconductor chips 1.

As shown in the FIG. 3, it is possible to detect the distribution of stress applied to the stress detecting semiconductor chips 1 due to resin encapsulation by superimposing one upon the other a change in the resistance of each piezoelectric resistive element 3 from before to after the resin encapsulation on the imaginary semiconductor chip 9 having the same plane size as that of the stress detecting semiconductor chip 1.

Next are described verification results for accuracy and reproducibility of measured data of the stress-distribution detecting semiconductor package group of the present embodiment and the semiconductor-package stress-distribution detection method using the stress-distribution detecting semiconductor package group according to the present embodiment.

Seventeen stress detecting semiconductor chips 1 (shown in FIG. 1) were taken from each of different arbitrary locations (six regions) within a single wafer, and the rate of change of the resistance was measured for a total of 102 stress detecting semiconductor chips 1 to examine accuracy and reproducibility of the measured data.

In the verification process, measured results of the different arbitrary locations (six regions) within a single wafer exhibited the same trend with respect to the positions (seventeen positions shown in FIG. 1) of the piezoelectric resistive elements 3 in the stress detecting semiconductor chips 1. This indicates that the measurements using the stress-distribution detecting semiconductor package group of the present embodiment and the semiconductor-package stress-distribution detection method using the stress-distribution detection semiconductor package group according to the present embodiment are able to detect the property changes in the stress detecting semiconductor chips 1.

The inventors of the present application have obtained similar results for different chip sizes, and thus have confirmation that the stress-distribution detecting semiconductor package group of the present embodiment and the semiconductor-package stress-distribution detection method using the stress-distribution detecting semiconductor package group according to the present embodiment provide sufficient measurement accuracy and reproducibility.

Figure 4:
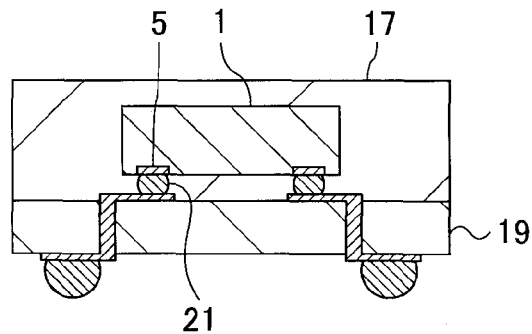
FIG. 4 is a cross-sectional diagram showing another example of the stress-distribution detecting semiconductor package.

In the above embodiment, the stress-distribution detecting semiconductor package 11 has a resin encapsulation structure including the lead frame 13, bonding wires 15 and molding resin 17. However, the stress-distribution detecting semiconductor package of the present invention is not limited to this case, and may have a different resin encapsulation structure. For instance, as shown in FIG. 4, the stress-distribution detecting semiconductor package of the present invention may be formed such that the stress detecting semiconductor chip 1 is flip-chip mounted on a wiring substrate 19 via solder bumps 21 and then resin-encapsulated.

Figure 5:
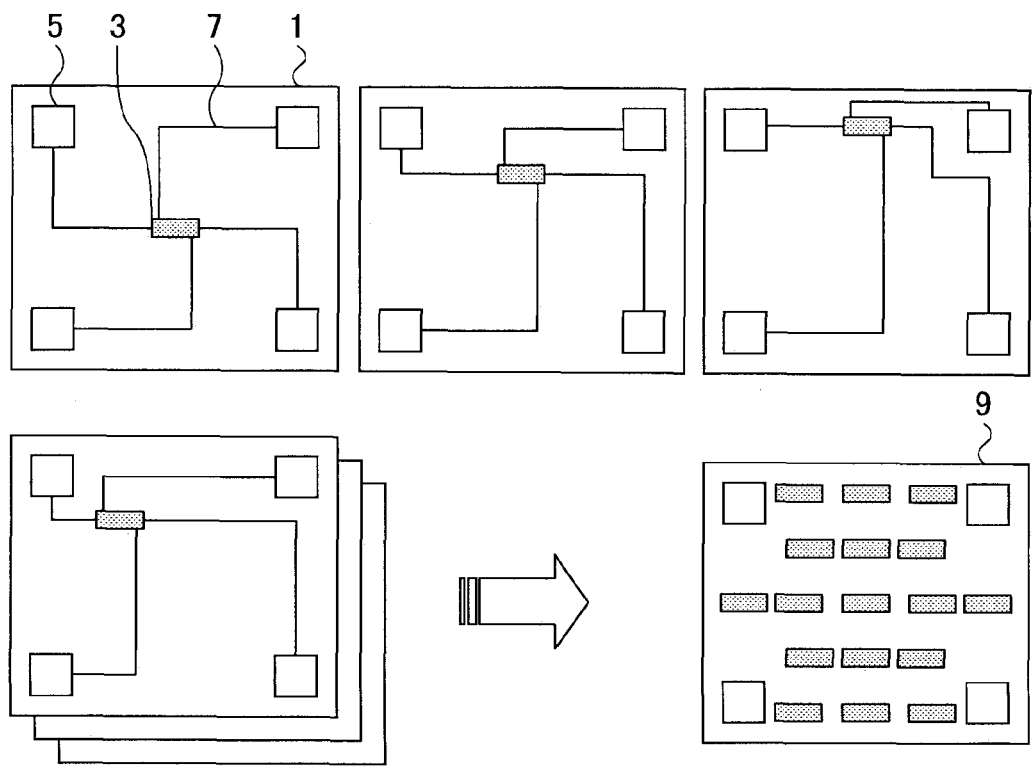
FIG. 5 is a schematic plan view of another arrangement of the electrode pads and the piezoelectric resistive element on the stress detecting semiconductor chip of each stress-distribution detecting semiconductor package.

Further in the above embodiment, all the seventeen piezoelectric resistive elements 3 have their longitudinal directions along the same direction on the plane surface of the corresponding stress detecting semiconductor chips 1, and detection of the stress applied to the stress detecting semiconductor chips 1 due to resin encapsulation is made only in the single direction. However, in order to perform more thorough detection of the stress due to resin encapsulation, another group of stress detecting semiconductor chips 1, as shown in FIG. 5, may also be used where their piezoelectric resistive elements 3 are provided in a direction perpendicular to the direction in which the piezoelectric resistive elements 3 of FIG. 1 are arranged. Further thorough detection of the stress distribution can be made by providing, in addition to the group of the perpendicular direction, yet another group of stress detecting semiconductor chips 1, of which the piezoelectric resistive elements 3 are arranged at a 45-degree angle to the direction of the piezoelectric resistive elements 3 of FIG. 1.

Figure 6:
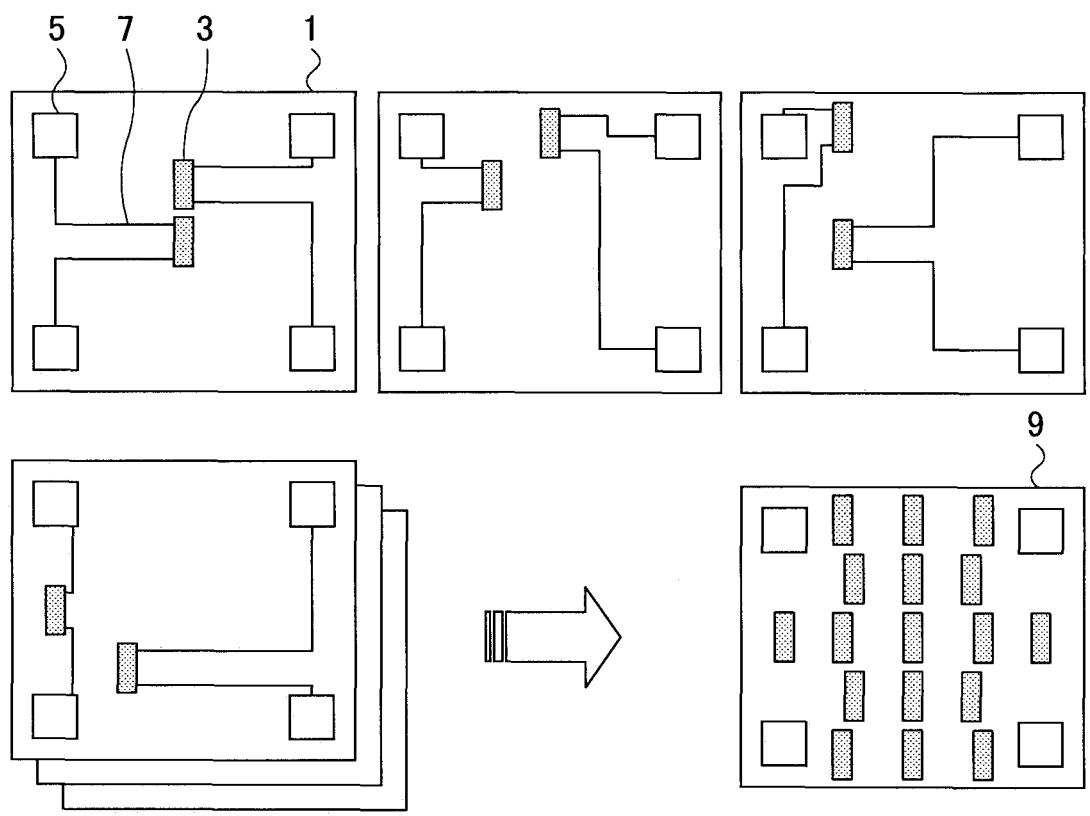
FIG. 6 is a schematic plan view of yet another arrangement of the electrode pads and the piezoelectric resistive element on the stress detecting semiconductor chip of each stress-distribution detecting semiconductor package.

Further in the above embodiment, four electrode pads 5 are connected to the piezoelectric resistive element 3 in order to enable the resistance measurement by the four-terminal method. However, to measure the resistance of the piezoelectric resistive element 3, it suffices that at least one electrode pad is connected to each terminal of the piezoelectric resistive element 3. For example, as shown in FIG. 6, two piezoelectric resistive elements 3 may be provided in the stress detecting semiconductor chip 1 having four electrode pads 5.

Also, the number of electrode pads 5 provided in the stress detecting semiconductor chip 1 is not limited to four. The number of electrode pads 5 can be adjusted in accordance with the number of electrode pads of a finished semiconductor chip in which the measurement results of the stress distribution are to be reflected.

Figure 7:
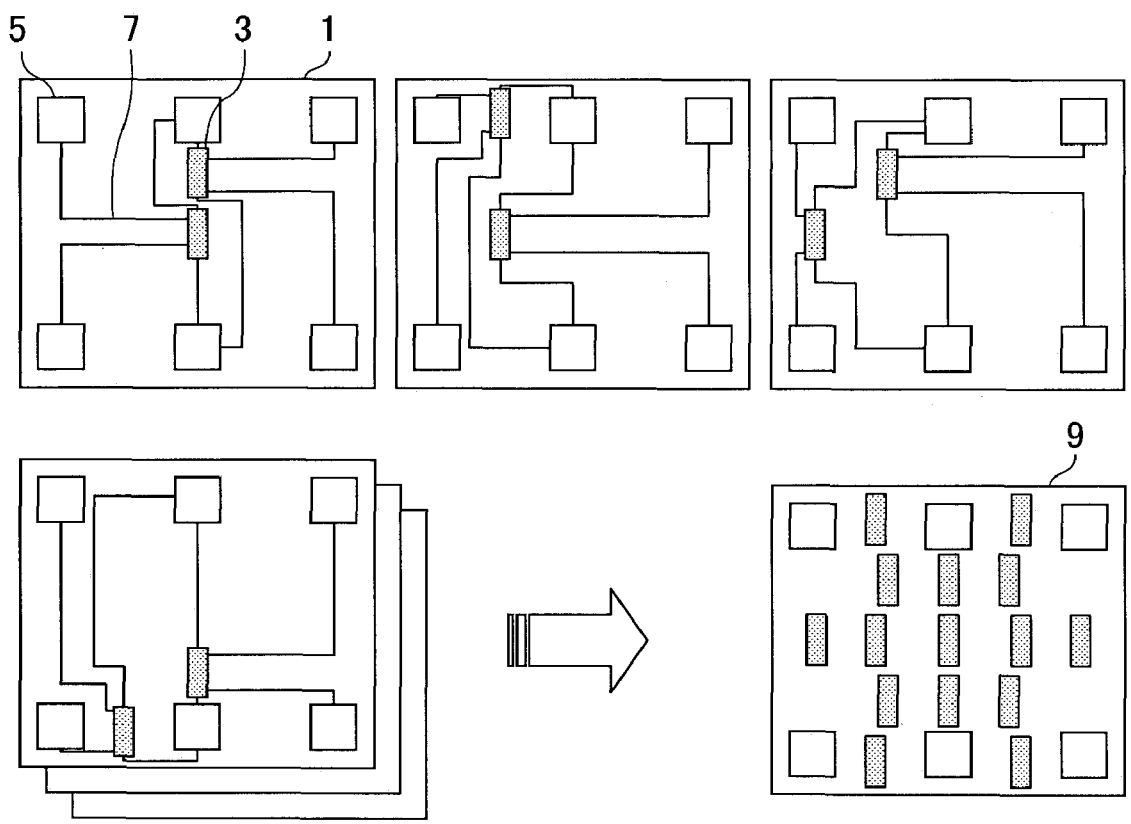
FIG. 7 is a schematic plan view of yet another arrangement of the electrode pads and the piezoelectric resistive element on the stress detecting semiconductor chip of each stress-distribution detecting semiconductor package.

For instance, as shown in FIG. 7, the stress detecting semiconductor chip 1 may have six electrode pads 5. In this case, two piezoelectric resistive elements 3 are provided in the stress detecting semiconductor chip 1, and these piezoelectric resistive elements 3 share two of the six electrode pads 5 for supplying current to the piezoelectric resistive elements 3, whereby the resistance of the two piezoelectric resistive elements 3 can be measured by the four-terminal method.

In the above embodiment, piezoelectric resistive elements formed of diffusion resistances are used as the stress-detection piezoelectric elements. However, the present invention can be realized by using piezoelectric elements other than the piezoelectric resistive elements as the stress-detection piezoelectric elements. That is to say, the operation and effects of the present invention can be achieved, provided the piezoelectric elements change their electrical properties in response to stress.

Figure 8:
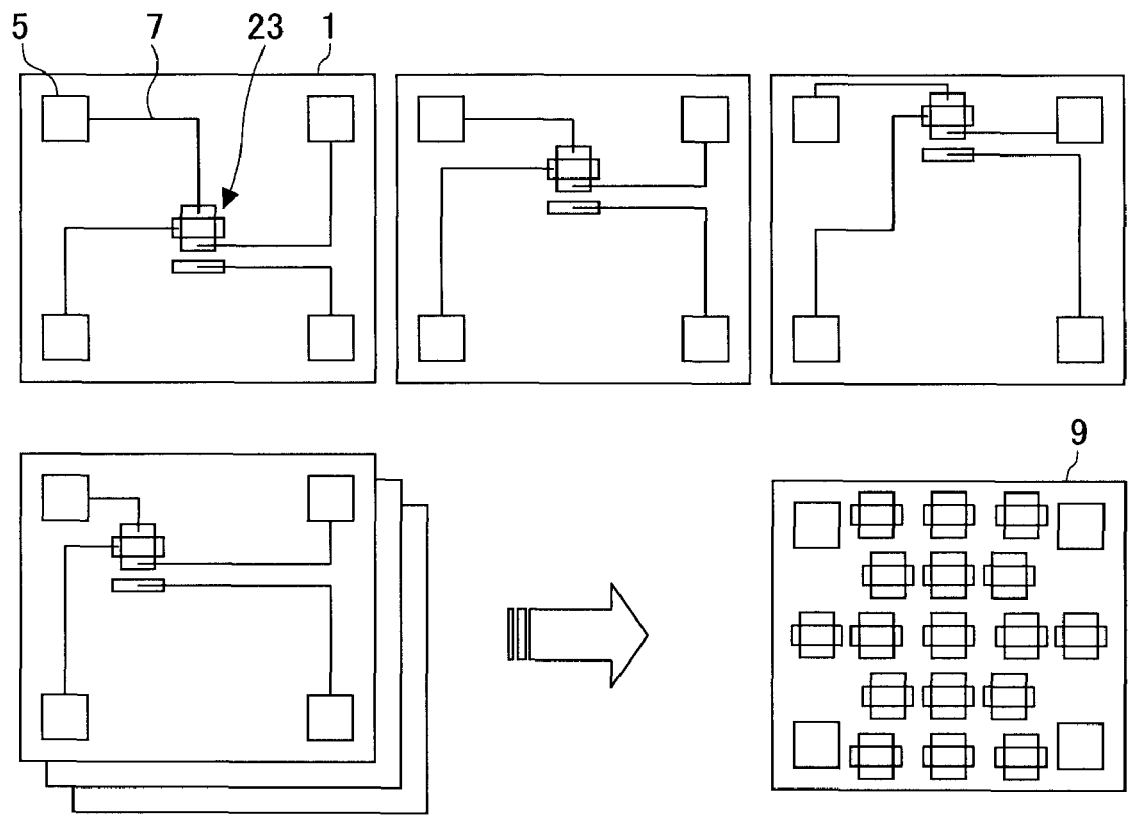
FIG. 8 illustrates another embodiment of the stress-distribution detecting semiconductor package group of the present invention, and shows a schematic plan view of an arrangement of electrode pads and a stress-detection MOS transistor on a stress detecting semiconductor chip of each stress-distribution detecting semiconductor package.
Figure 9:
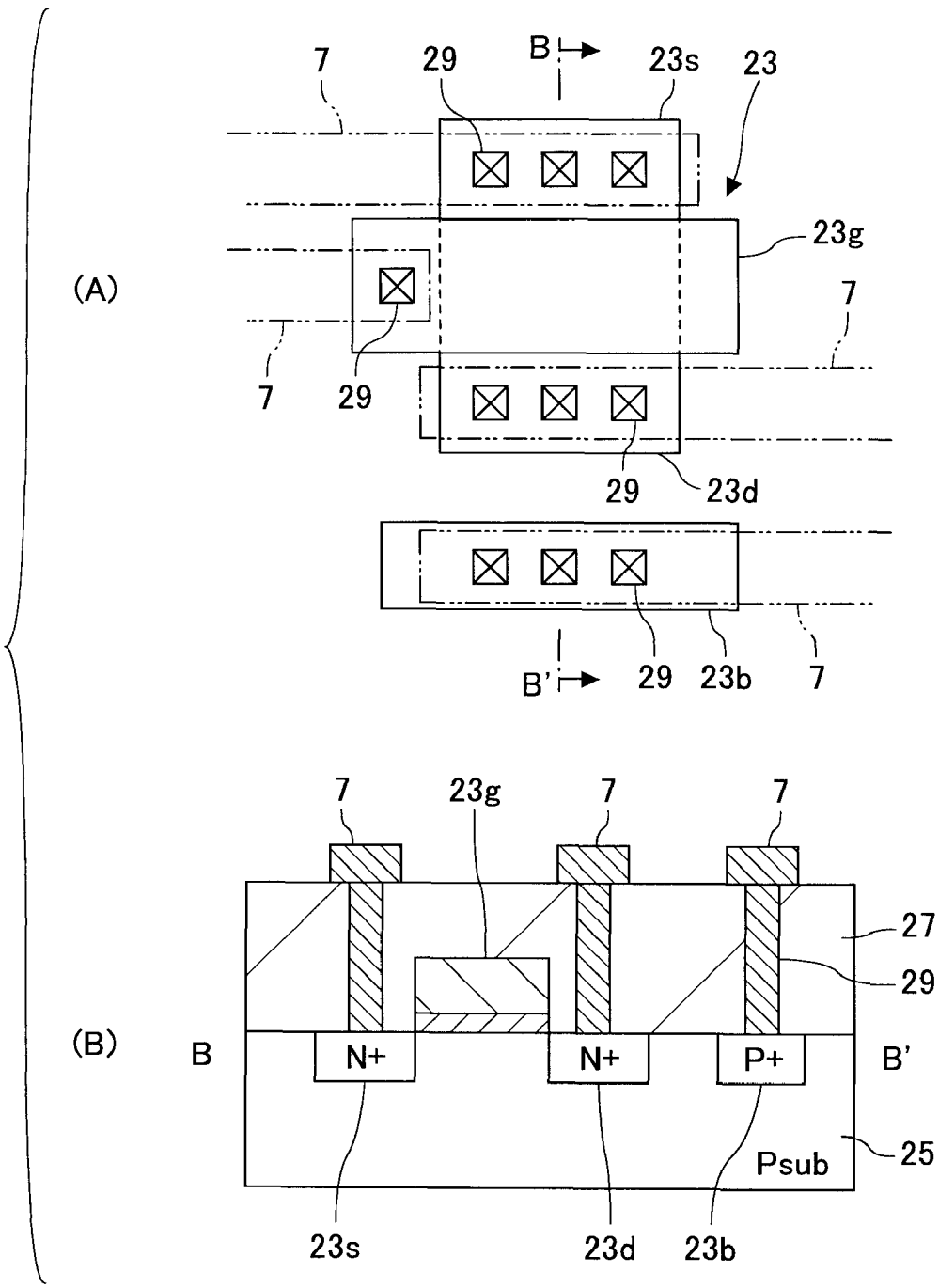
FIG. 9 shows a general overview of a structure of the stress-detection MOS transistor of FIG. 8, with FIG. 9(A) providing a plan view and FIG. 9(B) providing a cross-sectional view along the line B-B'.

FIG. 8 illustrates another embodiment of the stress-distribution detecting semiconductor package group of the present invention, and shows a schematic plan view of an arrangement of electrode pads and a stress-detection MOS transistor on a stress detecting semiconductor chip of each stress-distribution detecting semiconductor package. In this embodiment, MOS transistors are used as piezoelectric elements for stress detection. FIG. 9 shows a general overview of the structure of the stress-detection MOS transistor, with FIG. 9(A) providing a plan view and FIG. 9(B) providing a cross-sectional view along the line B-B'.

The stress-distribution detecting semiconductor package group of the present embodiment comprises, for instance, seventeen stress-distribution detecting semiconductor packages. According to the present embodiment, the stress detecting semiconductor chip 1 in each stress-distribution detecting semiconductor package differs from that of the foregoing embodiment of FIG. 1 in having, as the stress-detection piezoelectric element, a MOS transistor 23 in place of the piezoelectric resistive element 3.

Each MOS transistor 23 is an N-channel type, for example. The MOS transistor 23 includes an N-type source 23s and an N-type drain 23d which are formed of N-type diffusion layers (N+) in a P-type semiconductor substrate (Psub) 25 with a space between them; and a polysilicon gate electrode 23g formed above a region of the P-type semiconductor substrate 25 between the N-type source 23s and the N-type drain 23d, with an insulating film therebetween. The P-type semiconductor substrate 25 includes a substrate contact diffusion layer 23b formed of a P-type diffusion layer (P+) for receiving a substrate potential of the MOS transistor 23.

An interlayer insulating film 27 is formed on the P-type semiconductor substrate 25 in such a manner to cover the MOS transistor 23 and the substrate contact diffusion layer 23b. Contact holes are formed in the interlayer insulating film 27, at predetermined positions above the N-type source 23s, N-type drain 23d, gate electrode 23g and substrate contact diffusion layer 23b. Contacts 29 are formed by filling the contact holes with an electrically-conductive material. The wiring patterns 7 are formed on the interlayer insulating film 27 and contacts 29. The electrode pads 5 (see FIG. 8) are also formed on the interlayer insulating film 27.

The N-type source 23s, N-type drain 23d, gate electrode 23g and substrate contact diffusion layer 23b are respectively electrically connected to different electrode pads 5 via the contacts 29 and wiring patterns 7. Connecting in this manner enables measurement of the electrical property of the MOS transistor 23.

Seventeen stress detecting semiconductor chips 1 have their respective MOS transistors 23 at different positions relative to each other. In FIG. 8, the position of each MOS transistor 23 of the seventeen stress detecting semiconductor chips 1 is shown by superimposing the MOS transistors 23 on the imaginary semiconductor chip 9 having the same plane size as that of the stress detecting semiconductor chip 1. As shown in the imaginary semiconductor chip 9, the MOS transistors 23 are arranged so as to be evenly distributed across the plane of the imaginary semiconductor chip 9.

Property change over the entire extent of the stress detecting semiconductor chip 1 can be determined by measuring changes in the electrical property of the MOS transistors 23 from before to after the stress detecting semiconductor chips 1 are encapsulated, whereby the stress distribution over the entire extent of the stress detecting semiconductor chip 1 can be detected.

An advantage of using a MOS transistor as a piezoelectric element is that since the channel resistance is as high as a few megohms (MΩ), even if parasitic resistance of a few ohms is included, the effect of the parasitic resistance is less likely to be a problem. That is, it is possible to perform highly accurate measurements less subject to parasitic resistances. Furthermore, the same channel resistance can be obtained if the ratio W/L (a channel width W and a channel length L) for the transistors is the same, and accordingly the transistors can be reduced in size, thereby enabling stress measurements in a microarea.

The embodiment illustrated in FIGS. 8 and 9 is described with the case in which the stress-detection MOS transistors are N-channel MOS transistors; however, the same operation and effects can be obtained by using P-channel MOS transistors.

Figure 10:
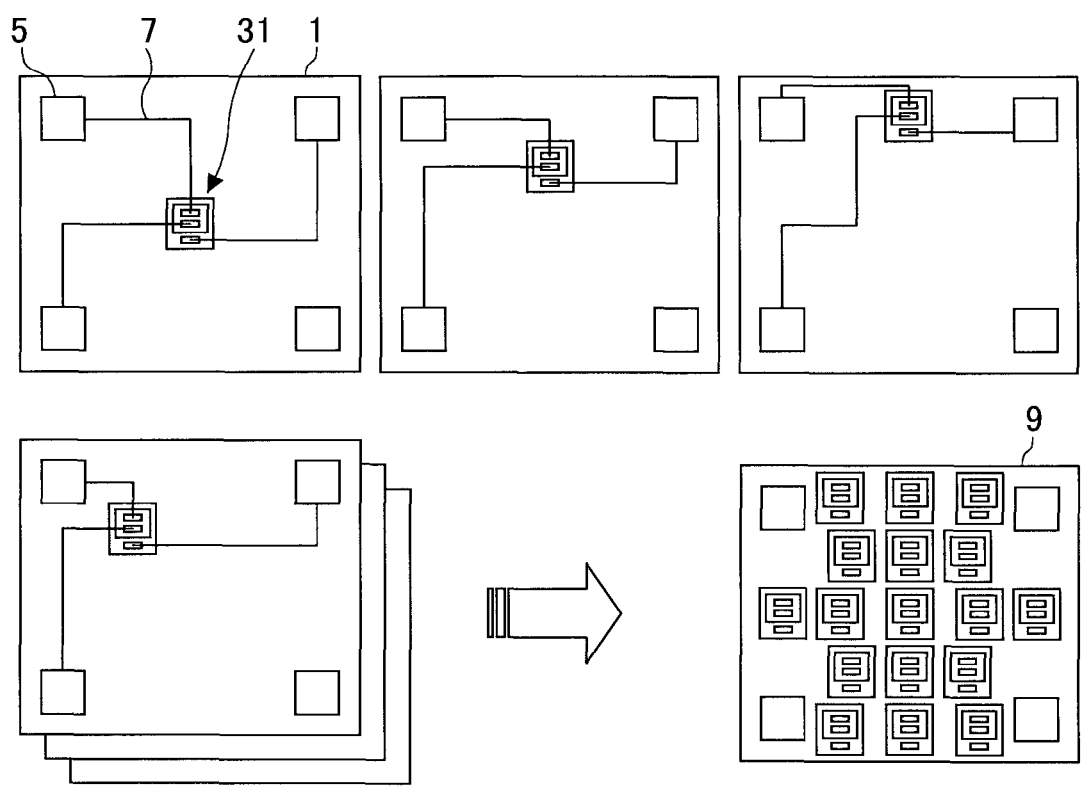
FIG. 10 illustrates yet another embodiment of the stress-distribution detecting semiconductor package group of the present invention, and shows a schematic plan view of an arrangement of electrode pads and a stress-detection bipolar transistor on a stress detecting semiconductor chip of each stress-distribution detecting semiconductor package.
Figure 11:
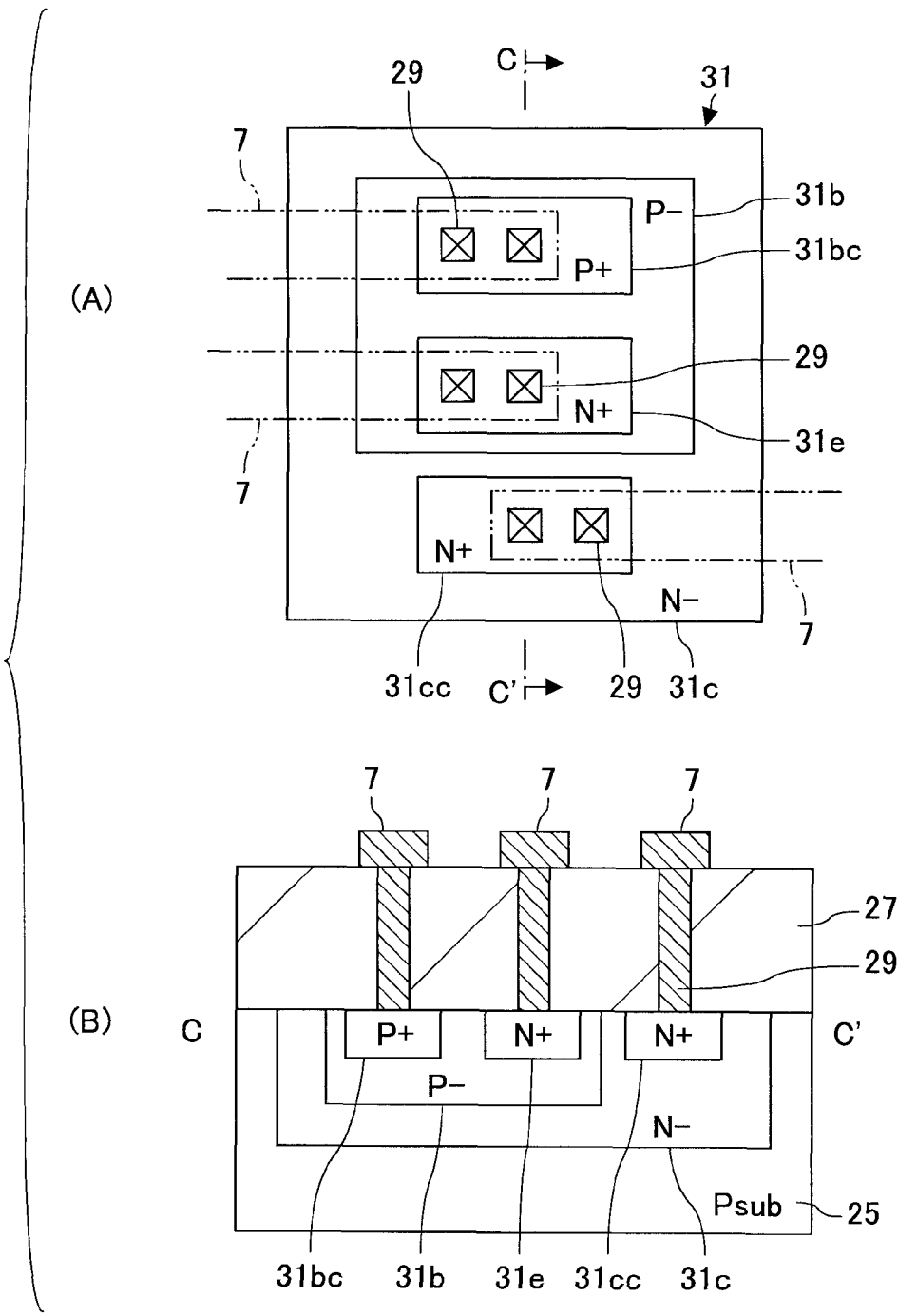
FIG. 11 shows a general overview of a structure of the stress-detection bipolar transistor of FIG. 10, with FIG. 11(A) providing a plan view and FIG. 11(B) providing a cross-sectional view along the line C-C'.

FIG. 10 illustrates yet another embodiment of the stress-distribution detecting semiconductor package group of the present invention, and shows a schematic plan view of an arrangement of electrode pads and a stress-detection bipolar transistor on a stress detecting semiconductor chip of each stress-distribution detecting semiconductor package. In this embodiment, bipolar transistors are used as piezoelectric elements for stress detection. FIG. 11 shows a general overview of the structure of the stress-detection bipolar transistor, with FIG. 11(A) providing a plan view and FIG. 11(B) providing a cross-sectional view along the line C-C'.

The stress-distribution detecting semiconductor package group of the present embodiment comprises, for instance, seventeen stress-distribution detecting semiconductor packages. According to the present embodiment, the stress detecting semiconductor chip 1 in each stress-distribution detecting semiconductor package differs from that of the foregoing embodiment of FIG. 1 in having, as the stress-detection piezoelectric element, a bipolar transistor 31 in place of the piezoelectric resistive element 3.

Each bipolar transistor 31 is an NPN-type, for example. The bipolar transistor 31 includes an N-type collector 31c formed of an N-type diffusion layer (N−) in the P-type semiconductor substrate (Psub) 25; a P-type base 31b formed of a P-type diffusion layer (P−) in the N-type collector 31c; and an N-type emitter 31e formed of an N-type diffusion layer (N+) in the P-type base 31b. An N-type collector contact diffusion layer 31cc formed of an N-type diffusion layer (N+) is formed in the N-type collector 31c. A P-type base contact diffusion layer 31bc formed of a P-type diffusion layer (P+) is formed in the P-type base 31b.

The interlayer insulating film 27 is formed on the P-type semiconductor substrate 25 in such a manner to cover the bipolar transistor 31. Contact holes are formed in the interlayer insulating film 27, at predetermined positions above the N-type collector contact diffusion layer 31cc, P-type base contact diffusion layer 31bc and N-type emitter 31e. The contacts 29 are formed by filling the contact holes with an electrically-conductive material. The wiring patterns 7 are formed on the interlayer insulating film 27 and contacts 29. The electrode pads 5 (see FIG. 10) are also formed on the interlayer insulating film 27.

The N-type collector 31c is electrically connected to an electrode pad 5 via the N-type collector contact diffusion layer 31cc, a contact 29 and a wiring pattern 7. The P-type base 31b is electrically connected to an electrode pad 5 via the P-type base contact diffusion layer 31bc, a contact 29 and a wiring pattern 7. The N-type emitter 31e is electrically connected to an electrode pad 5 via a contact 29 and a wiring pattern 7. The N-type collector 31c, P-type base 31b and N-type emitter 31e are respectively connected to different electrode pads 5. Connecting in this manner enables measurement of the electrical property of the bipolar transistor 31.

Four electrode pads 5 are provided on the stress detecting semiconductor chip 1, and one of the electrode pads 5 is not connected to the bipolar transistor 31. In the resin-encapsulating process of the stress detecting semiconductor chip 1, connecting terminals—such as bonding wires and solder bumps—are connected to all four electrode pads 5 so that the stress detecting semiconductor chip 1 has the same resin encapsulation structure as the finished semiconductor chip.

Seventeen stress detecting semiconductor chips 1 have their respective bipolar transistors 31 at different positions relative to each other. In FIG. 10, the position of each bipolar transistor 31 of the seventeen stress detecting semiconductor chips 1 is shown by superimposing the bipolar transistors 31 on the imaginary semiconductor chip 9 having the same plane size as that of the stress detecting semiconductor chip 1. As shown in the imaginary semiconductor chip 9, the bipolar transistors 31 are arranged so as to be evenly distributed across the plane of the imaginary semiconductor chip 9.

Property change over the entire extent of the stress detecting semiconductor chip 1 can be determined by measuring changes in the electrical property of the bipolar transistors 31 from before to after the stress detecting semiconductor chips 1 are encapsulated, whereby the stress distribution over the entire extent of the stress detecting semiconductor chip 1 can be detected.

An advantage of using a bipolar transistor as a stress-detection piezoelectric element is that the property change can be evaluated using three terminals. That is to say, in the case where a finished semiconductor chip has only three terminals, the bipolar transistors allow measurements of change in the electrical property whereas the evaluation itself cannot be performed by the piezoelectric resistive elements using the four-terminal method or by the MOS transistors requiring four terminals for their operations.

The embodiment illustrated in FIGS. 10 and 11 is described for the case in which the stress-detection bipolar transistors are the NPN-type; however, the same operation and effects can be obtained by using PNP-type bipolar transistors.

Figure 12:
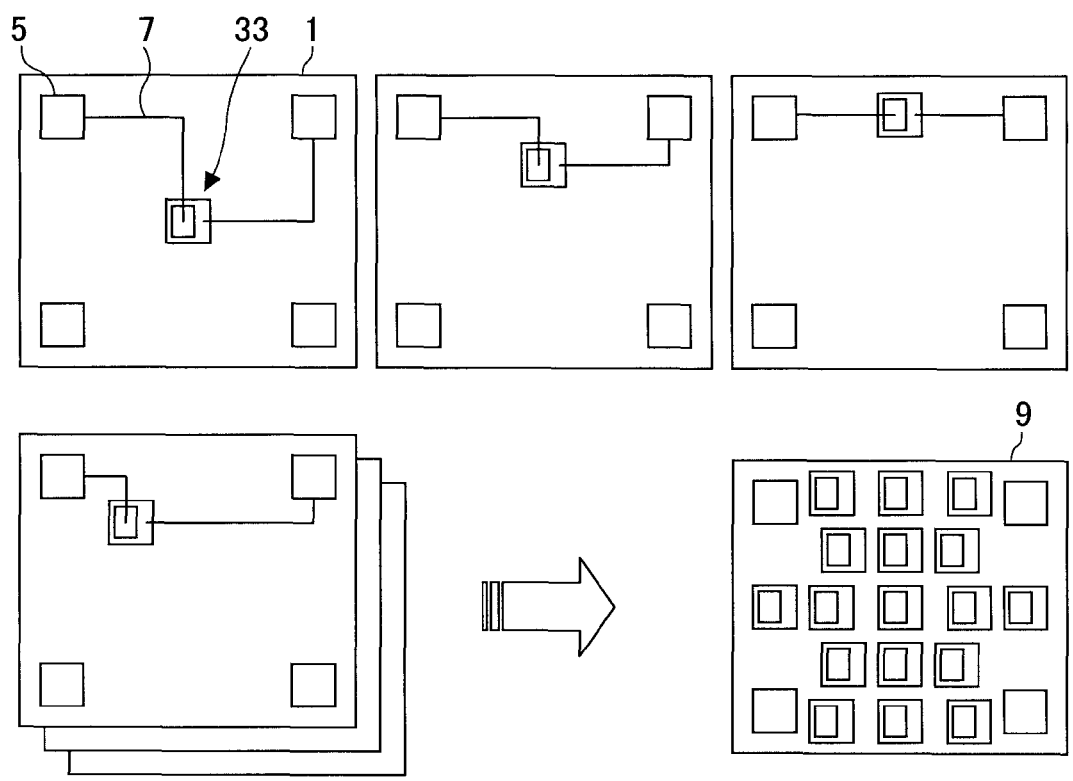
FIG. 12 illustrates yet another embodiment of the stress-distribution detecting semiconductor package group of the present invention, and shows a schematic plan view of an arrangement of electrode pads and a stress-detection double-layer polysilicon capacitive element on a stress detecting semiconductor chip of each stress-distribution detecting semiconductor package.
Figure 13:
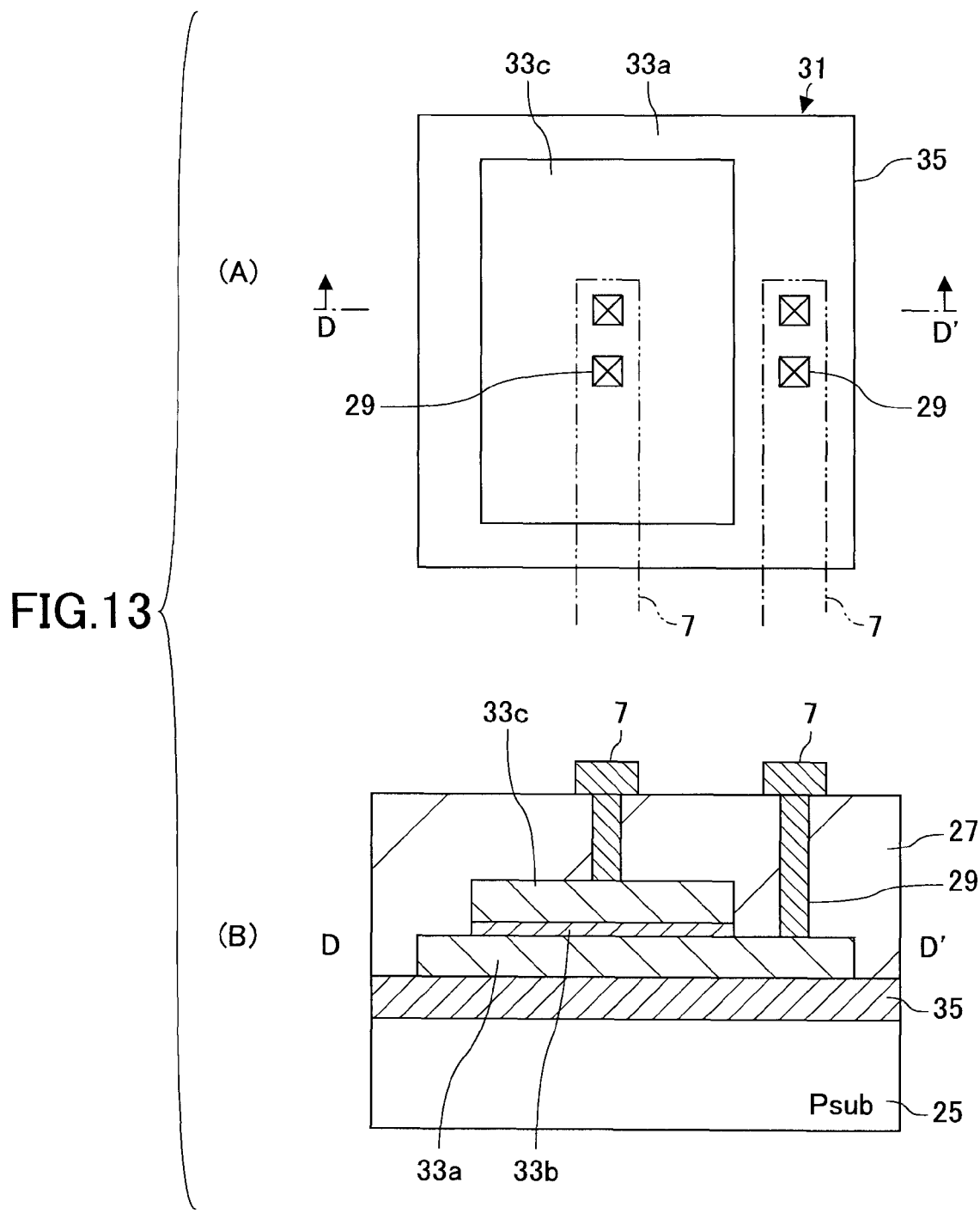
FIG. 13 shows a general overview of a structure of the stress-detection double-layer polysilicon capacitive element of FIG. 12, with FIG. 13(A) providing a plan view and FIG. 13(B) providing a cross-sectional view along the line D-D'.

FIG. 12 illustrates yet another embodiment of the stress-distribution detecting semiconductor package group of the present invention, and shows a schematic plan view of an arrangement of electrode pads and a stress-detection double-layer polysilicon capacitive element on a stress detecting semiconductor chip of each stress-distribution detecting semiconductor package. In this embodiment, double-layer polysilicon capacitive elements are used as piezoelectric elements for stress detection. FIG. 13 shows a general overview of the structure of the stress-detection double-layer polysilicon capacitive element, with FIG. 13(A) providing a plan view and FIG. 13(B) providing a cross-sectional view along the line D-D'.

The stress-distribution detecting semiconductor package group of the present embodiment comprises, for instance, seventeen stress-distribution detecting semiconductor packages. According to the present embodiment, the stress detecting semiconductor chip 1 in each stress-distribution detecting semiconductor package differs from that of the foregoing embodiment of FIG. 1 in having, as the stress-detection piezoelectric element, a double-layer polysilicon capacitive element 33 in place of the piezoelectric resistive element 3.

Each double-layer polysilicon capacitive element 33 includes, for example, a lower polysilicon electrode 33a on an LOCOS (local oxidation of silicon) oxide film 35 that is formed on the surface of the P-type semiconductor substrate (Psub) 25; and an upper polysilicon electrode 33c formed on the lower polysilicon electrode 33a with an insulating film 33b interposed therebetween.

The interlayer insulating film 27 is formed on the P-type semiconductor substrate 25 in such a manner to cover the double-layer polysilicon capacitive element 33. Contact holes are formed in the interlayer insulating film 27, at predetermined positions above the lower polysilicon electrode 33a and upper polysilicon electrode 33c. The contacts 29 are formed by filling the contact holes with an electrically-conductive material. The wiring patterns 7 are formed on the interlayer insulating film 27 and contacts 29. The electrode pads 5 (see FIG. 12) are also formed on the interlayer insulating film 27.

The lower polysilicon electrode 33a and upper polysilicon electrode 33c are respectively electrically connected to different electrode pads 5 via the contacts 29 and wiring patterns 7. Connecting in this manner enables measurement of the electrical property of the double-layer polysilicon capacitive element 33.

Four electrode pads 5 are provided in the stress detecting semiconductor chip 1, and two of the electrode pads 5 are not connected to the double-layer polysilicon capacitive element 33. In the resin-encapsulating process of the stress detecting semiconductor chip 1, connecting terminals—such as bonding wires and solder bumps—are connected to all four electrode pads 5 so that the stress detecting semiconductor chip 1 has the same resin encapsulation structure as the finished semiconductor chip.

Seventeen stress detecting semiconductor chips 1 have their respective double-layer polysilicon capacitive elements 33 at different positions relative to each other. In FIG. 12, the position of each double-layer polysilicon capacitive element 33 of the seventeen stress detecting semiconductor chips 1 is shown by superimposing the double-layer polysilicon capacitive elements 33 on the imaginary semiconductor chip 9 having the same plane size as that of the stress detecting semiconductor chip 1. As shown in the imaginary semiconductor chip 9, the double-layer polysilicon capacitive elements 33 are arranged so as to be evenly distributed across the plane of the imaginary semiconductor chip 9.

Property change over the entire extent of the stress detecting semiconductor chip 1 can be determined by measuring changes in the electrical property of the double-layer polysilicon capacitive elements 33 from before to after the stress detecting semiconductor chips 1 are encapsulated, whereby the stress distribution over the entire extent of the stress detecting semiconductor chip 1 can be detected.

An advantage of using a double-layer polysilicon capacitive element as a piezoelectric element is that the property change can be evaluated using two terminals. Therefore, it is possible to evaluate the property change of a finished semiconductor chip having only two terminals. In addition, a high-precision analog semiconductor has an internal filter circuit or the like that uses double-layer polysilicon capacitive elements, and therefore the stress detecting semiconductor chips using double-layer polysilicon capacitive elements are effective to improve the precision of such an analog semiconductor.

The embodiment illustrated in FIGS. 12 and 13 is described for the case in which the stress-detection capacitive elements are double-layer polysilicon capacitive elements; however, the same operation and effects can be obtained by using stress-detection capacitive elements of which each lower electrode is formed of a diffusion layer in the semiconductor substrate and each upper electrode is made of polysilicon.

According to the stress-distribution detecting semiconductor package group of one embodiment of the present invention, the piezoelectric elements of the stress detecting semiconductor packages are disposed on the corresponding stress detecting semiconductor chips to be located at different positions from one another when superimposed on a single imaginary semiconductor chip plane having the same plane size as that of the stress detecting semiconductor chips. The semiconductor-package stress-distribution detection method according to one embodiment of the present invention uses the stress-distribution detecting semiconductor package group of the embodiment of the present invention. Therefore, the distribution of stress applied to the stress detecting semiconductor chips due to resin encapsulation is detected by superimposing change in the electrical property of each piezoelectric element from before to after the resin encapsulation on the single imaginary semiconductor chip plane. Herewith, even in the case where only one piezoelectric element is provided (at one point) on the stress detecting semiconductor chip in each stress-distribution detecting semiconductor package, change in the electrical property of the piezoelectric element over the entire extent of the stress detecting semiconductor chip can be measured by providing the number of stress-distribution detecting semiconductor packages equal to the number of measurement points necessary for the measurements. Accordingly, the present invention allows detecting the stress distribution over the entire extent of the stress detecting semiconductor chip regardless of the number of electrode pads of a finished semiconductor chip of which the measurement results of the stress distribution are to be reflected.

Note that the number of piezoelectric elements provided on the stress detecting semiconductor chip in each stress-distribution detecting semiconductor package is not limited to one, and each stress detecting semiconductor chip may have multiple stress-detection piezoelectric elements.

In the stress-distribution detecting semiconductor package group of one embodiment of the present invention and the semiconductor-package stress-distribution detection method according to one embodiment of the present invention, the resistance measurements can be made more accurately when piezoelectric resistive elements formed of diffusion resistances are used as the piezoelectric elements. However, the piezoelectric elements of the present invention are not limited to the piezoelectric resistive elements formed of diffusion resistances, and piezoelectric elements having any type of structure may be employed instead, provided they change their electrical properties in response to stress. Examples of such are MOS transistors, bipolar transistors and capacitive elements.

In the stress-distribution detecting semiconductor package group of one embodiment of the present invention and the semiconductor-package stress-distribution detection method according to one embodiment of the present invention, the four-terminal method is employed to measure the resistance of the piezoelectric elements. The four-terminal method allows accurate measurements of the resistance since the internal resistance of the voltmeter is significantly high and current hardly flows through the voltage measurement circuit, thus making negligible the effects of voltage drops due to interconnection resistance, contact resistance and the like.

Furthermore, because of the highly accurate measurements realized by the four-terminal method, the plane size of the piezoelectric resistive elements can be reduced. For example, the plane size of a conventional stress-detection piezoelectric resistive element is 50 μm×200 μm or larger; however, by the four-terminal method, highly accurate measurements can be achieved even if the plane size of the piezoelectric resistive element is 10 μm×50 μm or smaller. In the stress-distribution detecting semiconductor package group according to the present invention, by providing such small stress-detection piezoelectric resistive elements on the stress detecting semiconductor chips, it is possible to increase the number of stress measurement points on the chip plane, thereby enabling more thorough detection of stress distribution. Such small piezoelectric resistive elements are effective especially when the stress detecting semiconductor chips have a small plane size—e.g. 1×1 mm, or when a finished semiconductor chip in which the detected stress distribution is to be reflected has a fewer number of electrode pads.

The stress-distribution detecting semiconductor package group and the semiconductor-package stress-distribution detection method using the stress-distribution detecting semiconductor package group according to the present invention have been described in detail with respect to certain preferred embodiments above. However, the physical parameters—including size, shape, arrangement, materials and the like—shown above are merely examples, and therefore the present invention is not limited to these specific details and various modifications to the invention could be possible within the scope of the present invention as defined in the claims.

This application is based on Japanese Patent Application No. 2007-233092 filed in the Japan Patent Office on Sep. 7, 2007, the contents of which are hereby incorporated herein by reference.

What is claimed is:

1. A stress-distribution detecting semiconductor package group comprising:
    a plurality of stress-distribution detecting semiconductor packages each formed by resin-encapsulating a stress detecting semiconductor chip of a same size using an identical resin encapsulation structure,
    wherein each of the stress detecting semiconductor chips of the stress-distribution detecting semiconductor packages includes a piezoelectric element for stress detection and at least two electrode pads electrically connected to the piezoelectric element to measure an electrical property of the piezoelectric element, and the piezoelectric elements of the respective stress detecting semiconductor chips are disposed on the corresponding stress detecting semiconductor chips to be located at different positions relative to one another when superimposed on a single imaginary semiconductor chip plane having a same plane size as a plane size of the stress detecting semiconductor chips.

2. The stress-distribution detecting semiconductor package group as claimed in claim 1, wherein the piezoelectric elements are piezoelectric resistive elements formed of diffusion resistances, and each stress detecting semiconductor chip includes at least four electrode pads electrically connected to the piezoelectric element to measure a resistance of the piezoelectric element by a four-terminal method.

3. A semiconductor-package stress-distribution detection method using the stress-distribution detecting semiconductor package group recited in claim 1, the semiconductor-package stress-distribution detection method comprising the steps of:
    measuring the electrical property of the piezoelectric element for each stress detecting semiconductor chip before resin encapsulation;

resin-encapsulating each stress detecting semiconductor chip to form the stress-distribution detecting semiconductor packages;

measuring the electrical property of the piezoelectric element for each stress-distribution detecting semiconductor package after the resin encapsulation; and superimposing change in the electrical property of each piezoelectric element from before to after the resin encapsulation on a single imaginary semiconductor chip plane having a same plane size as a plane size of the stress detecting semiconductor chips to thereby detect distribution of stress applied to the stress detecting semiconductor chips due to the resin encapsulation.

4. The semiconductor-package stress-distribution detection method as claimed in claim 3, wherein the piezoelectric elements are piezoelectric resistive elements formed of diffusion resistances, and each stress detecting semiconductor chip includes at least four electrode pads electrically connected to the piezoelectric element to measure a resistance of the piezoelectric element by a four-terminal method.

* * * * *